219-121.
9-4-73 OR 3,757,075 SR

United States Patent [19]

Munt

[11] 3,757,075

[45] Sept. 4, 1973

[54] METHOD FOR PRODUCING SMALL CONTACTS OF UNIFORM THICKNESS FOR THICK-FILM CIRCUITS

[75] Inventor: Hartwig Munt, Munich, Germany

[73] Assignee: Siemens Aktiengesellschaft, Berlin and Munich, Germany

[22] Filed: Feb. 1, 1971

[21] Appl. No.: 111,538

[30] Foreign Application Priority Data

Feb. 3, 1970 Germany .................. P 20 04 857.1

[52] U.S. Cl. .............. 219/121 LM, 29/625, 29/630, 117/8

[51] Int. Cl. .............................................. B23k 27/00

[58] Field of Search .................. 219/121 L, 121 EB; 117/8, 212; 29/625, 629, 630, 620

[56] References Cited

UNITED STATES PATENTS

| | | | |
|---|---|---|---|
| 3,140,379 | 7/1964 | Schleich et al. | 219/69 R |
| 3,530,573 | 9/1970 | Helgeland | 219/121 LM |
| 3,360,398 | 12/1967 | Garibotti | 219/121 LM |
| 3,601,745 | 8/1971 | Helgeland | 219/121 L |

OTHER PUBLICATIONS

"Laser Trimming of Thick Film Resistors Using Continuously Pumped Repetitively Q Switched N+++YAG" Rodney L. Walters, 8/69, pp. 1–6

Electronics, Cletus M. Wiley, October 1962, pp. 39–43

"YAG Laser Resistor Trimmer," D. V. Haffnel and J. W. Summerford, 8/69, IECP Symposium, San Francisco, Calf., pp. 1–7

*Primary Examiner*—J. V. Truhe
*Assistant Examiner*—George A. Montanye
*Attorney*—Curt M. Avery, Arthur E. Wilfond, Herbert Lerner, Daniel J. Tick and Curt M. Avery

[57] ABSTRACT

A method of producing small contacts of uniform thickness for thick film circuits has the steps of applying interconnected contacts to a substrate of nonconductive material, firing the contacts to secure the later to the substrate, and subdividing the interconnected contacts to form mutually separated individual contacts.

1 Claim, 2 Drawing Figures

METHOD FOR PRODUCING SMALL CONTACTS OF UNIFORM THICKNESS FOR THICK-FILM CIRCUITS

Figure 1:
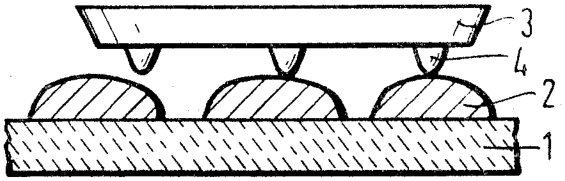
Fig.1 PRIOR ART

My invention relates to a method for producing small contact regions of uniform thickness in thick film circuits. The contact areas produced by the method according to the invention are especially suitable for facilitating the placement of active semiconductor circuits.

It is known to join active components which are formed in a semiconductor substrate to circuits having the form of layers on a substrate of insulating material, these circuits containing mostly only passive components. For this purpose, contact regions are placed onto the substrate of insulating material. The contact regions are raised in height with respect to the conducting path layers and the electrical components in layer form that are disposed on the substrate; these contact regions correspond in size and form with contacts on the semiconductor substrate.

To insure a certain contact between the circuit, of the semiconductor substrate and the circuit on the substrate of insulating material, it is necessary that the contact regions are uniform in height over the entire substrate to the highest degree possible. This requirement is relatively easily fulfilled when the contact regions are produced in accordance with methods based on vacuum technology. However, it is quite different with the so-called thick film circuits wherein the metals are pressed upon the substrate in paste like form with the aid of stencil screening techniques and are subsequently fired to secure the metal to the substrate. These special method techniques have the disadvantage that the surface of the small regeions is not level, because of the surface tension of the metallizing material. Specifically, the surface of the small areas cause humped contours and this situation in turn leads to defective connections when the semiconductor substrates are placed upon the base or carrier substrate.

Stencil screening and thick-film circuits are discussed in an article by W.F.Ebling entitled: "Some Practical Considerations In The Fabrication Of Printed Glaze Resistors And Circuits." The article appears on page 8–16 of Proc. El. Comp. Conf., 1966, Washington.

Attemps have been made to obtain contact regions without the non-linear surface contours by using a special printing paste and an especially fine stencil screen. However, these special methods have been found to be expensive and time consuming.

Accordingly, it is an object of my invention to provide a method of producing small contact regions of uniform thickness in thick-film circuits which is simpler than the methods heretofore known and which does not exhibit the above mentioned disadvantages.

According to a feature of the invention a cohesive metal layer is applied to a substrate of non-conductive material. The metal layer is fired to join the latter to the substrate and the cohesive layer is then mutually separated into individual contacts by means of a pencil beam of electromagnetic energy.

Another object of my invention is to provide a method of producing small contacts of uniform thickness for thickfilm circuits wherein a coarse screen and inexpensive metal paste material can be used.

A further object of my invention is to provide a method of producing small contacts of uniform thickness for thickfilm circuits wherein a special printing step for the contacts is eliminated.

Another object is to provide a method of producing small contacts of uniform thickness wherein the individual contact surfaces have a practically ideal flat surface.

A still other object of my invention is to provide a method of producing small contacts of uniform thickness wherein the interconnected contacts are subdivided with more cleanliness and more precision as compared with the contacts obtained with the aid of sandblasting beams applied by miniature sandblasting apparatus in the manufacture of thick-film resistances.

The method according to the invention affords an advantage that the screen printing is achieved by using a simple coarse screen and inexpensive metal paste. Also, the advantage is provide that a special printing step for the contact regions becomes unnecessary and that the individual contact areas have a practically ideal flat surface.

Indeed, it would also be possible to achieve the separation of the cohesive metal layer into individual contacts with the aid of photoetching techniques. In contrast to such techniques however, the method according to the invention is simpler, faster and cleaner. The use of a pencil beam of electromagnetic energy is particularly advantageous, because the electrical components are treated with electromagnetic energy, for example, for adjusting the resistance values. It is advantageous to use an electron beam or a laser as an electromagnetic energy source. In this connection the laser has the advantage that the vacuum chamber required with an electron radiation method is not needed.

Also the use of sandblast beams produced by miniature sandblasting apparatus that is used in the production of thick film resistances is unnecessary. Compared to such techniques the method according to the invention wherein electromagnetic radiation is used affords the significant advantage of cleanliness an precision.

Figure 2:
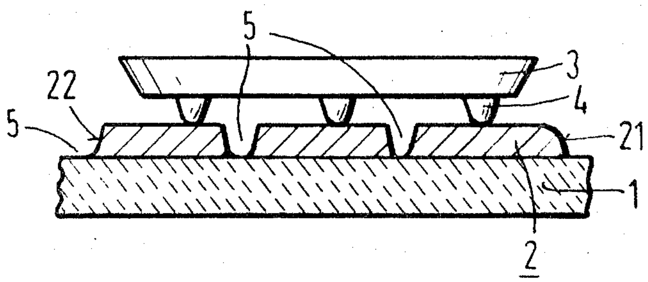

The invention will now be described with reference to the drawings wherein:

FIG. 1 illustrates a thick film circuit with a flip-chip component secured thereto as is known in the art up to the present time; and, FIG. 2 illustrates the same general arrangement as FIG. 1, however here the flip-chip is secured to a thick-film circuit having contact regions produced in accordance with the method of the invention.

Referring to FIG. 1, individual contact areas 2 are applied to a substrate 1 made of non-conductive material, for example, glass or ceramic. The contact areas 2 are printed to the substrate 1 by means of a stencil screen application. The contacts are then burned in. As a consequence of the special characteristics of this fabrication technique, the surface of the contacts 2 are arched in a humped fashion. Therefore it can easily occur that one of the contact areas 4 of the semiconductor substrate 3 do not contact or touch the surface of the contact areas 2 when the semiconductor substrate or flip-chip 3 is placed upon the substrate 1, so that in the subsequent bonding process, for example, soldering, brazing or welding, ultrasonic welding or thermocompression bonding no connection is produced and the entire circuit must be scrapped.

In the contrast to the results obtained with regard to the arrangement illustrated in FIG. 1, the situation is very different with a thick-film circuit as illustrated in FIG. 2 Referring now to FIG.2, contact regions 2 are first printed upon sustrate 1 as flat cohesive metal areas. In this way the arch-like contour at the contact edges is reduced as illustrated by the contact portion designated by reference numeral 21. The remaining surface is completely flat. The contact regions 2 can be made with a metal such as palladium, silver, gold, platinum or an alloy of two or more of the foregoing. The substrate 1 can be of a material such as glass or ceramic. Thereafter, cuts 5 are made for example by a focused laser beam over the entire joined contact area therby subdividing the latter into individual contact areas separated from each other. In this way the limited arch-like contour at the edge can also be removed as illustrated by reference numeral 22 altough this is not absolutely necessary.

When the semiconductor substrate or flip-chip 3 is subsequently placed upon substrate 1, the contact areas 4 touch everywhere the corresponding contact regions 2 on the substrate 1 and a certain and sure electrical connection is guaranteed. As already mentioned, the subdivision of the cohesive metal areas into individual contact areas 2 can be performed subsequent to the adjustment of resistance values, so that no additional step and no special apparatus is necessary.

While the invention has been described by means of specific examples and in a specific embodiment I do not wish to be limited thereto, for obvious modifications will occur to those skilled in the art without departing from spirit and scope of the invention.

I claim:

1. A method of producing small contact surfaces of uniform thickness in semiconductor substrates for disposition in circuit relationship with thick-film circuits of semiconductor components by flip chip means, including the steps of: stencil screening a cohesive metal layer onto said substrate of electrically non-conductive material, firing said metal layer to secure the same to said substrate, and subdividing said metal layer with a pencil beam of electromagnetic energy, thereby forming mutually separated individual contacts having substantially flat surfaces of uniform thickness.

* * * * *